United States Patent [19]

Medelius et al.

[11] Patent Number: 5,894,223
[45] Date of Patent: Apr. 13, 1999

[54] NON-INTRUSIVE CABLE TESTER

[75] Inventors: Pedro J. Medelius, Merritt Island; Howard J. Simpson, Melbourne, both of Fla.

[73] Assignee: The United States of America as represented by the Administrator of the National Aeronautics and Space Administration, Washington, D.C.

[21] Appl. No.: 08/936,643

[22] Filed: Sep. 24, 1997

[51] Int. Cl.$^6$ .................... G01R 31/08; G01R 31/02
[52] U.S. Cl. ................ 324/529; 324/522; 324/527; 324/543
[58] Field of Search ...................... 324/520, 522, 324/523, 527, 529, 531, 539, 543

[56] References Cited

U.S. PATENT DOCUMENTS

| | | | |
|---|---|---|---|
| 3,751,606 | 8/1973 | Kaiser, Jr. | 179/175.3 |
| 3,781,665 | 12/1973 | Gale | 324/52 |
| 3,904,839 | 9/1975 | Peoples | 179/175.3 |
| 3,978,282 | 8/1976 | Fulton et al. | 178/69 |
| 4,322,677 | 3/1982 | Wright | 324/531 |
| 4,438,389 | 3/1984 | De Sa | 324/52 |
| 4,517,511 | 5/1985 | Suto | 324/529 |
| 4,791,377 | 12/1988 | Grandfield, Jr. et al. | 328/14 |
| 4,973,911 | 11/1990 | Marshall | 324/529 |
| 5,068,614 | 11/1991 | Fields et al. | 324/534 |
| 5,083,086 | 1/1992 | Steiner | 324/533 |
| 5,101,161 | 3/1992 | Walsh et al. | 324/543 |
| 5,172,058 | 12/1992 | Tasca | 324/225 |
| 5,210,498 | 5/1993 | Paananen | 324/529 |
| 5,361,029 | 11/1994 | Rider et al. | 324/326 |
| 5,383,084 | 1/1995 | Gershen et al. | 324/520 |
| 5,463,317 | 10/1995 | Murphy | 324/520 |
| 5,469,066 | 11/1995 | Ito et al. | 324/551 |
| 5,477,152 | 12/1995 | Hayhurst | 324/542 |
| 5,488,304 | 1/1996 | Hamade et al. | 324/520 |
| 5,498,967 | 3/1996 | Bass et al. | 324/543 |
| 5,587,662 | 12/1996 | Kelley et al. | 324/520 |

*Primary Examiner*—Diep N. Do
*Attorney, Agent, or Firm*—Beth A. Vrioni

[57] ABSTRACT

A cable tester is described for low frequency testing of a cable for faults. The tester allows for testing a cable beyond a point where a signal conditioner is installed, minimizing the number of connections which have to be disconnected. A magnetic pickup coil is described for detecting a test signal injected into the cable. A narrow bandpass filter is described for increasing detection of the test signal. The bandpass filter reduces noise so that a high gain amplifier provided for detecting a test signal is not completely saturate by noise. To further increase the accuracy of the cable tester, processing gain is achieved by comparing the signal from the amplifier with at least one reference signal emulating the low frequency input signal injected into the cable. Different processing techniques are described evaluating a detected signal.

16 Claims, 1 Drawing Sheet

NON-INTRUSIVE CABLE TESTER

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 U.S.C. 2457)

TECHNICAL FIELD OF THE INVENTION

The present invention relates in general to a method and apparatus for determining a location of a short circuit or an open circuit in an electrical cable.

BACKGROUND OF THE INVENTION

The space shuttle uses dedicated signal conditioners (DSCs) for the purpose of conditioning transducer outputs and other signals to make them compatible with orbiter telemetry, displays and data processing systems. The dedicated signal conditioners are located throughout the orbiter, often in difficult to access locations in the vehicle fuselage. When troubleshooting a potential instrumentation problem, personnel frequently have to demate cables to verify that the cables are not the source of the problem. However, once a cable is demated, all dedicated signal conditioners and other systems which have a wire passing through the cable's connector have to be re-tested after the cable is re-connected. Due to their inaccessibility, the dedicated signal conditioners sometimes have to be removed in order to check them. This results in many man hours of re-validation testing on systems that were unrelated to the original problem. The cost to the shuttle program for these re-testing procedures is exorbitant. A system which allows cable continuity to be checked non-intrusively without demating the cables would therefore save many hours of testing and substantially reduce testing costs.

One known technique for non-intrusively checking cable continuity is time domain reflectometry (TDR). In time domain reflectometry, a high frequency pulse is injected into one end of the cable. A discontinuity in the cable causes a reflection of the pulse that can be detected back at the end where the pulse was injected. The location of this discontinuity can be determined by measuring the time interval between when the pulse was injected into the cable, and when the reflected pulse is detected. Also, the polarity of the reflected pulse is indicative of whether the discontinuity is a short circuit or an open circuit.

Unfortunately, time domain reflectometry is not feasible for detecting cable faults in the space shuttle. This is because time domain reflectometry uses high frequencies which are above a frequency cut-off of the dedicated signal conditioners. Further, the faults are typically only a few meters or less from the injection point, and time domain reflectometry is ineffective at these distances due to the extreme short total travel time (e.g., a few nanoseconds) of high frequency pulse.

For the reasons stated above, and for other reasons stated below which will become apparent to those skilled in the art upon reading and understanding the present specification, there is a need in the art for non-intrusive cable testing technique which provides the accuracy necessary for use in the space shuttle environment, and the like.

SUMMARY OF THE INVENTION

The above mentioned problems with testing cables and other problems are addressed by the present invention and which will be understood by reading and studying the following specification. A cable tester is described which uses a bandpass filter with a very narrow bandwidth to eliminate noise, and a signal detector to detect a test signal.

In particular, the present invention describes a cable tester comprising a low frequency signal generator for providing an input signal to one end of a cable under test and having a frequency X, and a sensor for sensing signals radiated along a length of the cable under test and providing a first output signal. A bandpass filter having a narrow bandwidth and having a center frequency substantially equal to frequency X is provided. The bandpass filter is coupled to the sensor for eliminating noise signals detected by the sensor and providing a second output signal. The cable tester also comprises a signal detector coupled to receive the second output signal from the bandpass filter. The signal detector processes the second output signal for detecting a component of the input signal having a frequency X.

In another embodiment, a method of detecting a fault in a cable is described. The method comprises the steps of coupling a low frequency input signal to one end of a cable under test, transmitting the low frequency input signal along a length of the cable, detecting a signal along the length of the cable, and filtering the detected signal with a narrow bandpass filter centered around a frequency of the low frequency input signal. The method also comprises the steps of amplifying an output signal of the narrow bandpass filter, and processing the amplified output signal to detect a signal corresponding to the low frequency input signal.

DETAILED DESCRIPTION OF THE INVENTION

Figure 1:
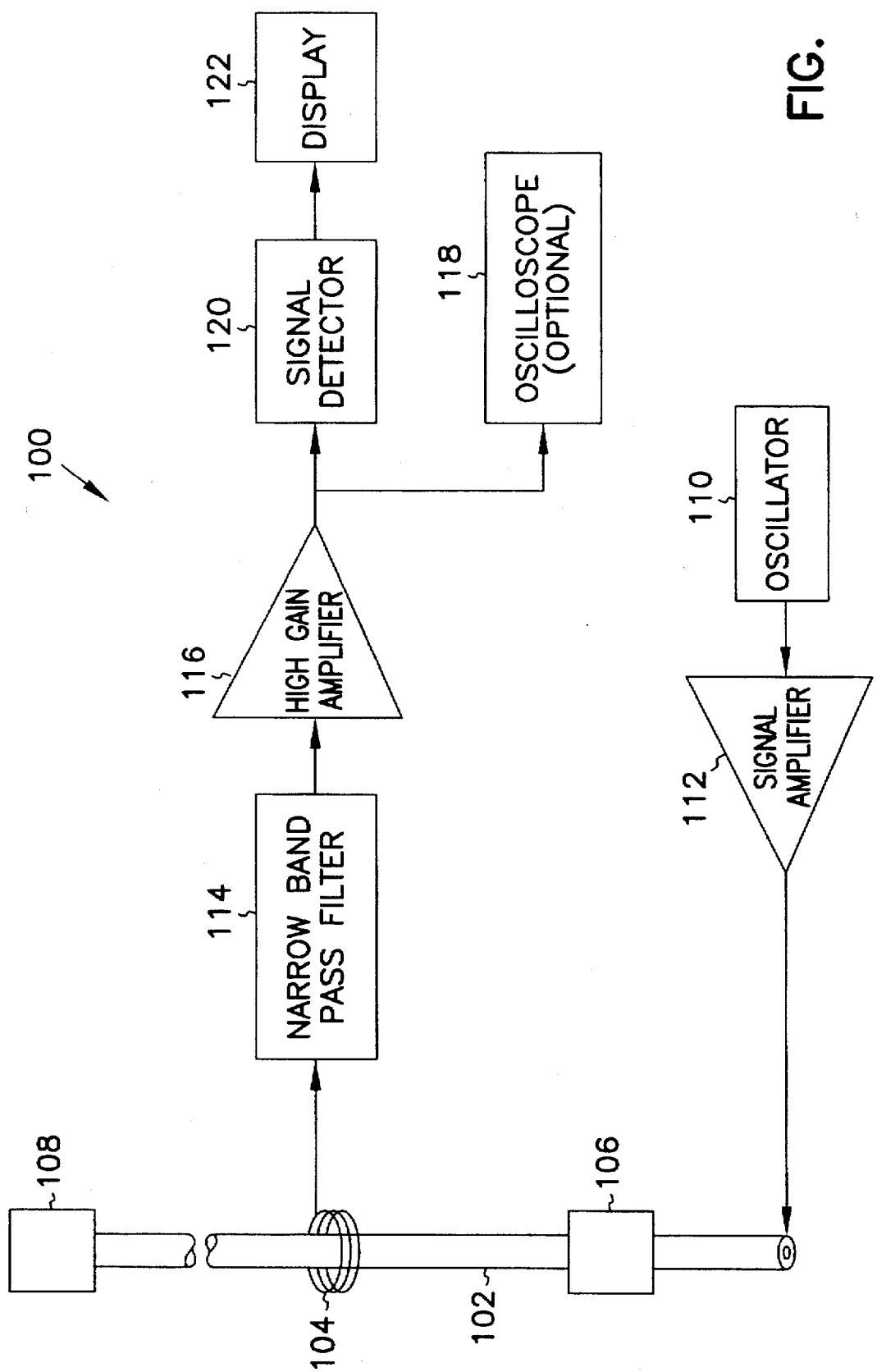
FIG. 1 is a block diagram of a cable tester of the present invention.

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

As described herein, the continuity of a cable can be tested non-intrusively by applying a test signal to one end of the cable and using a magnetic pickup coil to monitor the presence of that signal along the length of the wire. A short or an open circuit causes the pickup coil to lose the test signal when the coil moves past the open or short circuit. Thus, the absence of a signal indicates the location of the problem. Existing commercial cable testing equipment injects a signal in the several hundreds of kilohertz range. The use of such commercial equipment is not feasible when the dedicated signal conditioners are installed, since their frequency response is limited to a few tens of Hertz and such a high frequency would be severely attenuated by them. The presence of the dedicated signal conditioners makes imperative the use of a low frequency injection signal. This results in two major challenges. The first challenge is that the amount of energy radiated by a shielded cable is greatly reduced at lower frequencies since the shielding becomes almost 100% efficient. Second, the effectiveness of a pickup coil when subject to a varying magnetic field is directly proportional to the frequency of the signal being picked up.

These two challenges are overcome by using a cable tester having an operational frequency which is less than a cut-off frequency of installed dedicated signal conditioners, and includes a very narrow bandpass filter followed by a high gain amplifier stage. Referring to FIG. 1, a cable or conductor testing system 100 is described in greater detail. The system is used to detect a fault (short or open circuit) along the length of a cable 102, such as a coaxial cable or other conductor. The cable, as described above, can be located in a space shuttle, an aerospace application, aircraft, factories, or the like where low frequency communication is conducted. For example, in a space shuttle the cable is used to connect a transducer 108 to a dedicated signal conditioner 106. The dedicated signal conditioner is an amplifier typically provided to process a signal transmitted by the transducer to make this signal compatible with other telemetry, displays or processing systems (not shown). The cable tester includes an input oscillator 110 which generates a signal having a low center frequency. This center frequency in one embodiment is 10 Hz. The 10 Hz injected signal is derived from a crystal-controlled time base, thus ensuring its stability over time. Frequency stability is extremely important since a large frequency drift could put the injected signal outside the bandpass range of the amplifier. The output from the oscillator 110 is amplified by amplifier/driver 112 for inputting into one end of the cable. The amplifier/driver is designed to provide an adequate signal along the length of the cable being tested. Further, it will be appreciated by those skilled in the art that other low frequency signals can be injected into the cable without departing from the present invention. Thus, the input signal is not limited to 10 Hz, but can be any frequency compatible with installed signal conditioners and is preferably less than 50 Hz in a space shuttle application.

A magnetic pickup coil 104 is used to detect the input signal along the length of the cable. The pickup coil, as known to those skilled in the art, detects magnetic fields produced by signals transmitted through the cable. Commercially available coils are designed to allow the coil to be placed around the cable even when an end of the cable is not accessible. It is anticipated that the pickup coil is initially placed near the transducer 108 and incrementally moved toward the oscillator 110 to sample signals along the cable. When the input signal is detected, the location of the fault present in the cable is indicated as being between the last two sample regions. It will be appreciated, that the entire length of the cable will not be accessible and that the pickup coil may have to be removed from the cable to relocate for sampling during operation. Minimizing the cable distance covered between sample readings will more accurately pinpoint the location of the fault.

The output from the magnetic pickup coil is passed through a narrow bandpass filter 114 to eliminate noise detected by the coil. As described herein, the bandpass filter is very narrow and two embodiments of the filter have been tested. The first embodiment is a 16th order bandpass filter, with a 0.05 Hz bandwidth at a 10 Hz center frequency. In a second embodiment, an 8th order bandpass filter is used having a 0.1 Hz bandwidth at a 10 Hz center frequency. The center frequency of the bandpass filter is also crystal controlled to prevent any drifts that would result in a degradation in the performance of the sensor. It will be appreciated that other bandpass filters can be used, provided the bandwidth is sufficiently narrow to eliminate the majority of noise contributions to the signal. A "narrow bandwidth", as described herein, is preferably less than 0.5 Hz. Because the signal provided along the length of the cable and detected by the coil is extremely small, often having an amplitude smaller than a fraction of a microvolt, a high gain amplifier 116 is provided. The high gain amplifier provides a gain of approximately 60 to 100 dB, but can be adjusted based upon the signal detected by the coil and the detection circuitry provided. An injection frequency of 10 Hz was selected in order to ensure at the signal applied to one end of the cable could pass through the dedicated signal conditioners. Since the frequency of operation is relatively small, a high gain amplification stage must be used to detect the small signal radiated by the cable. The amount of noise applied to the amplifier's input is directly proportional to the bandwidth of the filter preceding it.

The output of the high gain amplifier is provided to a signal detector 120 and an optional oscilloscope 118. The oscilloscope is provided to allow a user to visually monitor the signal detected from the pickup coil and filtered by the bandpass filter. The signal detector, in one embodiment, can be a voltage detector 128 for monitoring the root mean square (RMS) of the signal. The output from the signal detector is then displayed on a display 122.

Because electromagnetic noise is present in most environments, and the cable 102 can be located in a bundle of cables, the level of 10 Hz signal emanating from the cable may be less than the noise level. While the bandpass filter 114 eliminates the majority of the noise detected by the pickup coil, noise remaining within the narrow region of the bandpass filter will still reach the signal detector. The signal detector, therefore, can be configured as a digital quadrature detector 124. Both the internal thermal noise of the amplifier and the background electromagnetic noise can overshadow the signal, making it indistinguishable from noise.

The digital quadrature detector, in essence, compares the detected signal with a reference signal to eliminate the noise component. The signal detector can comprise an analog to digital converter 126 for digitizing the amplified output signal. The reference signal emulates the 10 Hz input signal. By comparing the input test signal with the detected output signal, the accuracy of the cable tester is increased. For comparing the signals, the reference signal and the detected signal are multiplied together and their product is integrated over a given period of time. If the signals are the same frequency and phase, the additive nature of the integration will result in a positive, or DC value. If the signals are different (i.e. detected noise), the integration of the detected signal will be subtractive in nature, thus the integrated value will approach zero.

The digital quadrature detector 124 can be used to increase the detection sensitivity of the cable tester circuitry through processing gain. Electronic components, both active in passive, generate wideband noise. This can cause the amplifier described above to output a signal centered around 10 Hz even when a signal has not been injected into the cable under test. Although the 10 Hz signal produced by internal noise will be relatively small, it can make detection of a real test signal more difficult. The quadrature detector accurately detects the presence of an injected signal even when the signal to noise ratio is much smaller than unity. The quadrature detector operates based on the fact that the time integral of random noise is equal to zero as the time (t) approaches infinity. Also, the time integral of the multiplication of identical sine waves results in a DC component, while the time integral of two identical sine waves, but 90 degrees out of phase, is equal to zero. The signal available at the output of the high gain amplifier 116 can be digitized using an A/D converter, provided in the detector 120, for digital processing and comparison with reference digitized signals.

When a signal with known frequency and phase is mixed with noise, it's presence can be detected using a quadrature demodulator. Since the test signal is applied at the end of the cable, and the pickup coil can be used anywhere along the length of the cable, the use of a common signal generator between the input and detector becomes impractical. This is further complicated by the fact that the pickup coil and the narrow bandpass introduce additional phase shifts. To avoid this problem, in one embodiment, the quadrature demodulator includes a pair of digital multipliers operating at the same frequency as the signal being observed (10 Hz). One of the digital multipliers has the same phase as a signal of interest (I term), while the second digital multiplier is set to be 90 degrees out of phase (Q term). If only random noise is applied to the multipliers, the results will be small and have similar I and Q signal levels. When the signal is present, the result will be an I component larger than the Q-component. Additional processing gain can be achieved by increasing the integration time. Since the noise is typically random and gaussian, increasing the integration time decreases its effect on the I and Q signal levels. The display, which can be a computer display, LCD or simple light indicator, is appropriately activated to indicate when a test signal is detected.

In the above embodiment, the test signal received by the pickup coil must be in phase with the reference signal applied to the I-term multiplier. Since the test signal may be present on the cable, but out of phase, another embodiment is described which detects a valid test signal regardless of phase. In this embodiment, the digital signal detector 120 generates 18 sine waves with the same frequency as the test signal (10 Hz), but 10 degrees out of phase with respect to each other. Thus, 180 degrees are covered. The digital signal is multiplied by all 18 sine waves, and the products of each are integrated over a predetermined time period, for example a two second period. The digital signal detector monitors the largest integrated output value and compares it with the output corresponding to the integration value for the signal 90 degree out of phase from it. For example, if the integration using the reference signal 60 degrees out-of-phase from the test signal has the highest value, it is compared to the integration value using the signal with a 150 degrees out-of-phase signal. If the ratio of these two values is larger than a pre-defined value (>3 for example), a signal of the correct frequency is considered to be present. That is, if the highest value is three times greater than the value which is 90 degrees out-of-phase from it, the test signal is considered present. If only noise is present, the ratio will be closer to unity. The integration time can be extended to increase detection accuracy. It will be appreciated that the number of reference signals can be greater or smaller than 18. More reference signals can provide better detection, however, additional generators are needed. Again, the display is activated appropriately to indicate when a test signal is detected. The digital detector and the display can be embodied as a computer operating according to processing instructions, and does not have to be dedicated circuitry.

CONCLUSION

The present invention described herein allows for the testing of a cable to be performed in a cable beyond a point where a dedicated signal conditioner is installed, minimizing the number of connections which would otherwise have to be disconnected. The use of a narrow bandpass filter is key to the performance of the circuit. Without the filter, the noise level would completely saturate a high gain amplifier provided for detecting a test signal. To further increase the accuracy of the cable tester, processing gain has been achieved by comparing the detected signal from the amplifier with a reference signal emulating a low frequency input signal injected into the cable. Different processing techniques have been described for evaluating a detected signal against the reference signal.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A conductor tester comprising:
   a low frequency signal generator for providing an input signal to one end of a conductor under test having a frequency X;
   a sensor for sensing signals radiated along a length of the conductor under test and providing a first output signal;
   a bandpass filter having a narrow bandwidth and having a center frequency substantially equal to frequency X, and coupled to the sensor for eliminating noise signals detected by the sensor and providing a second output signal; and
   a signal detector coupled to receive the second output signal from the bandpass filter, the signal detector is a digital quadrature detector for comparing the output signal from the bandpass filter with at least one reference signal of frequency X.

2. The conductor tester of claim 1 further comprising a high gain amplifier coupled between the bandpass filter and the signal detector for amplifying the output signal from the bandpass filter.

3. The conductor tester of claim 1 wherein the sensor comprises a magnetic pickup coil for detecting magnetic fields radiating from the conductor under test.

4. The conductor tester of claim 1 wherein the signal detector comprises a voltage detector for providing an output voltage representing a root-mean-square (RMS) value of the output signal of the bandpass filter.

5. The conductor tester of claim 1 wherein the digital quadrature detector integrates a product of the reference signal and the output signal from the bandpass filter over a predetermined period of time and indicates if a resultant integration value exceeds a predetermined threshold level.

6. The conductor tester of claim 1 wherein the digital quadrature detector comprises:
   an analog to digital convertor for digitizing the output signal from the bandpass filter; and
   first and second signal generators, the first signal generator producing a first reference signal of frequency X which is in phase with the input signal, the second signal generator producing a second reference signal of frequency X which is 90 degrees out of phase with the input signal.

7. The conductor tester of claim 1 wherein the digital quadrature detector comprises:
   an analog to digital converter for digitizing the output signal from the bandpass filter; and
   a plurality of signal generators for generating a plurality of signals each having a frequency X and staggered phases.

8. The conductor tester of claim 1 wherein the bandpass filter has a bandwidth of less than 0.5 Hz.

9. The conductor tester of claim 1 wherein the bandpass filter has a bandwidth of less than 0.1 Hz.

10. The conductor tester of claim 1 wherein frequency X is 10 Hz.

11. A method of detecting a fault in a cable, the method comprising:

coupling a low frequency input signal to one end of a cable under test, and transmitting the low frequency input signal along a length of the cable;

detecting a signal along the length of the cable;

filtering the detected signal with a narrow bandpass filter centered around a frequency of the low frequency input signal;

amplifying an output signal of the narrow bandpass filter;

generating a reference signal having a frequency and phase corresponding to a frequency and phase of the low frequency input signal; and comparing the amplified output signal with the reference signal.

12. The method of claim 11 wherein the low frequency input signal has a frequency of 10 Hz.

13. The method of claim 11 wherein the narrow bandpass filter has a bandwidth of less than 0.5 Hz.

14. The method of claim 11 wherein comparing the amplified output signal comprises:

multiplying the amplified output signal with the reference signal integrating the multiplied signals over a pre-determined period of time; and determining if a resultant integration value exceeds a pre-determined threshold level.

15. The method of claim 11 wherein comparing the amplified output signal comprises:

multiplying the amplified output signal with each of a plurality of reference signals;

integrating each of the multiplied signals over a predetermined period of time;

selecting a largest resultant integration value; and comparing the selected value to a predetermined value.

16. A cable tester comprising:

a low frequency signal generator for providing an input signal to one end of a cable under test having a 10 Hz frequency;

a magnetic pickup coil for sensing signals radiated along a length of the cable under test and providing a first output signal;

a bandpass filter having a bandwidth of less than 0.5 Hz and having a center frequency substantially equal to 10 Hz, and coupled to the magnetic pickup coil for eliminating noise signals detected by the magnetic pickup coil and providing a second output signal;

a high gain amplifier coupled to receive the second output signal from the bandpass filter and provide an amplified output signal;

a signal detector coupled to receive the amplified output signal and detect a component of the input signal having a 10 Hz frequency, the signal detector comprising an analog to digital converter for digitizing the amplified output signal, and a plurality of signal generators for generating a plurality of signals each having a 10 Hz frequency and staggered phases; and a display for indicating a detection of a component of the input signal having a 10 Hz frequency.

\* \* \* \* \*